(12) United States Patent
Piccardo et al.

(10) Patent No.: US 10,630,074 B2
(45) Date of Patent: Apr. 21, 2020

(54) REDUNDANT SOLUTION OF OUTPUTS ON A RC VOLTAGE DIVIDER

(71) Applicant: SIEMENS AKTIENGESELLSCHAFT, Munich (DE)

(72) Inventors: Francesco Piccardo, Albisola (IT); Christian Weber, Basel (CH)

(73) Assignee: Siemens Aktiengesellschaft, Munich (DE)

( * ) Notice: Subject to any disclaimer, the term of this patent is extended or adjusted under 35 U.S.C. 154(b) by 255 days.

(21) Appl. No.: 15/327,085

(22) PCT Filed: Jul. 9, 2015

(86) PCT No.: PCT/EP2015/065685
§ 371 (c)(1),
(2) Date: Jan. 18, 2017

(87) PCT Pub. No.: WO2016/008795
PCT Pub. Date: Jan. 21, 2016

(65) Prior Publication Data
US 2017/0194787 A1    Jul. 6, 2017

(30) Foreign Application Priority Data

Jul. 18, 2014    (EP) .................................... 14177668

(51) Int. Cl.
*H02H 7/16*    (2006.01)
*H02H 9/04*    (2006.01)
*G01R 15/06*    (2006.01)
*H01C 7/12*    (2006.01)
*H04M 3/18*    (2006.01)

(52) U.S. Cl.
CPC ............. *H02H 9/045* (2013.01); *G01R 15/06* (2013.01); *H02H 7/16* (2013.01); *H01C 7/12* (2013.01); *H02H 9/041* (2013.01); *H04M 3/18* (2013.01)

(58) Field of Classification Search
USPC .................................................. 361/117–119
See application file for complete search history.

(56) References Cited

U.S. PATENT DOCUMENTS

| | | | |
|---|---|---|---|
| 1,835,080 A | | 12/1931 | Pfleger |
| 3,710,252 A | * | 1/1973 | Till ........................ G01R 15/14 323/354 |
| 3,795,840 A | * | 3/1974 | Cambra ................... H02H 9/06 361/119 |
| 4,034,283 A | * | 7/1977 | Pellegrino .............. G01R 15/06 323/370 |
| 4,087,744 A | | 5/1978 | Olsen |
| 5,059,910 A | * | 10/1991 | Ochi ....................... G01R 15/24 324/537 |

(Continued)

FOREIGN PATENT DOCUMENTS

| | | |
|---|---|---|
| CN | 202676780 U | 1/2013 |
| CN | 203149008 U | 8/2013 |

(Continued)

*Primary Examiner* — Danny Nguyen
(74) *Attorney, Agent, or Firm* — Laurence Greenberg; Werner Stemer; Ralph Locher

(57) ABSTRACT

An RC voltage divider includes a primary part and a secondary part. The secondary part includes at least two equivalent output circuits that are connected in series.

7 Claims, 2 Drawing Sheets

(56) References Cited

U.S. PATENT DOCUMENTS

| | | | |
|---|---|---|---|
| 6,177,665 B1 | 1/2001 | Wolf | |
| 6,563,908 B1 | 5/2003 | Enck, Jr. | |
| 8,063,649 B2 * | 11/2011 | Deibele | G01R 15/06 324/602 |
| 9,759,755 B2 | 9/2017 | De Rybel et al. | |
| 2012/0035058 A1 * | 2/2012 | Blakes | H01F 6/02 505/163 |
| 2012/0081097 A1 * | 4/2012 | Bimbach | G05F 1/10 323/304 |
| 2014/0021965 A1 | 1/2014 | De Rybel et al. | |

FOREIGN PATENT DOCUMENTS

| | | |
|---|---|---|
| CN | 103323640 A | 9/2013 |
| CN | 103718049 A | 4/2014 |
| EP | 0980003 A1 | 2/2000 |
| EP | 2689256 A1 | 1/2014 |
| RU | 2334240 C1 | 9/2008 |
| SU | 855533 B | 8/1981 |
| WO | 2004081589 A1 | 9/2004 |
| WO | 2006015966 A1 | 2/2006 |
| WO | 2006039976 A1 | 4/2006 |

\* cited by examiner

REDUNDANT SOLUTION OF OUTPUTS ON A RC VOLTAGE DIVIDER

BACKGROUND OF THE INVENTION

Field of the Invention

The invention relates to the technical field of RC voltage dividers.

In order to measure properties of a high voltage tension, RC voltage dividers are used for transforming high voltage to low voltage signals. Reliable and accurate measurement is important, since depending on the measured properties of a high voltage, it is e.g. to be decided whether an electrical substation is to be switched of. Taking wrong decisions can lead to unnecessary blackouts or damage of expensive parts of an electrical power transmission network.

For actual RC voltage dividers it is desirable to have an independent accurate redundancy of in minimum two secondary outputs. The main reason for redundancy is to fulfill the higher requirements given by the protection/measuring technology of the secondary equipment. It is desirable to achieve a better performance in case of problems with one of the two outputs and reduce the disturbance on to the remaining output to a value of e.g. lower than 0.2%.

This problem could not been solved satisfying until now. FIG. 1 shows an RC voltage divider 901 according to the prior art. The RC voltage divider 901 comprises a primary part 910 and a secondary part 920. The primary part 910 comprises a high voltage terminal 13 as input, capacitive element C11 and a resistive element R13. The secondary part comprises capacitive elements C22, Cf, resistive elements R24, Ra1, Ra2, and a voltage limiter F. Two cables 211, 221 are connected to the output of the RC voltage divider 901. The cables 211, 221 and the secondary part 20 are connected to ground terminals 99.

Up to now the redundancy system was including two or more cables 211, 221 and the following equipment. The divider was designed as a divider connection box and/or amplifiers connected to one secondary part of the divider, e.g. C22 and R24, as e.g. depicted in FIG. 1.

In case of a failure of the connected equipment, such as the cable 211, DCB box, amplifier, and converters, a big change of the impedance occurs. Therefore the disturbances in case of a breakdown of one output on the remaining ones can be 1% up to 50% depending on the solution in use.

BRIEF SUMMARY OF THE INVENTION

It is therefore an objective of the present invention to provide an RC voltage divider with highly stable redundant outputs.

This objective is solved by the voltage divider described below. Further advantageous embodiments are proposed by the dependent claims.

According to an aspect an RC voltage divider is proposed. The RC voltage divider comprises a primary part and a secondary part. The secondary part comprises at least two equivalent output circuits. The at least two equivalent output circuits are connected in series.

BRIEF DESCRIPTION OF THE SEVERAL VIEWS OF THE DRAWING

In the following the invention is described on the basis of embodiments illustrated on the basis of the figures.

DESCRIPTION OF THE INVENTION

Figure 1:
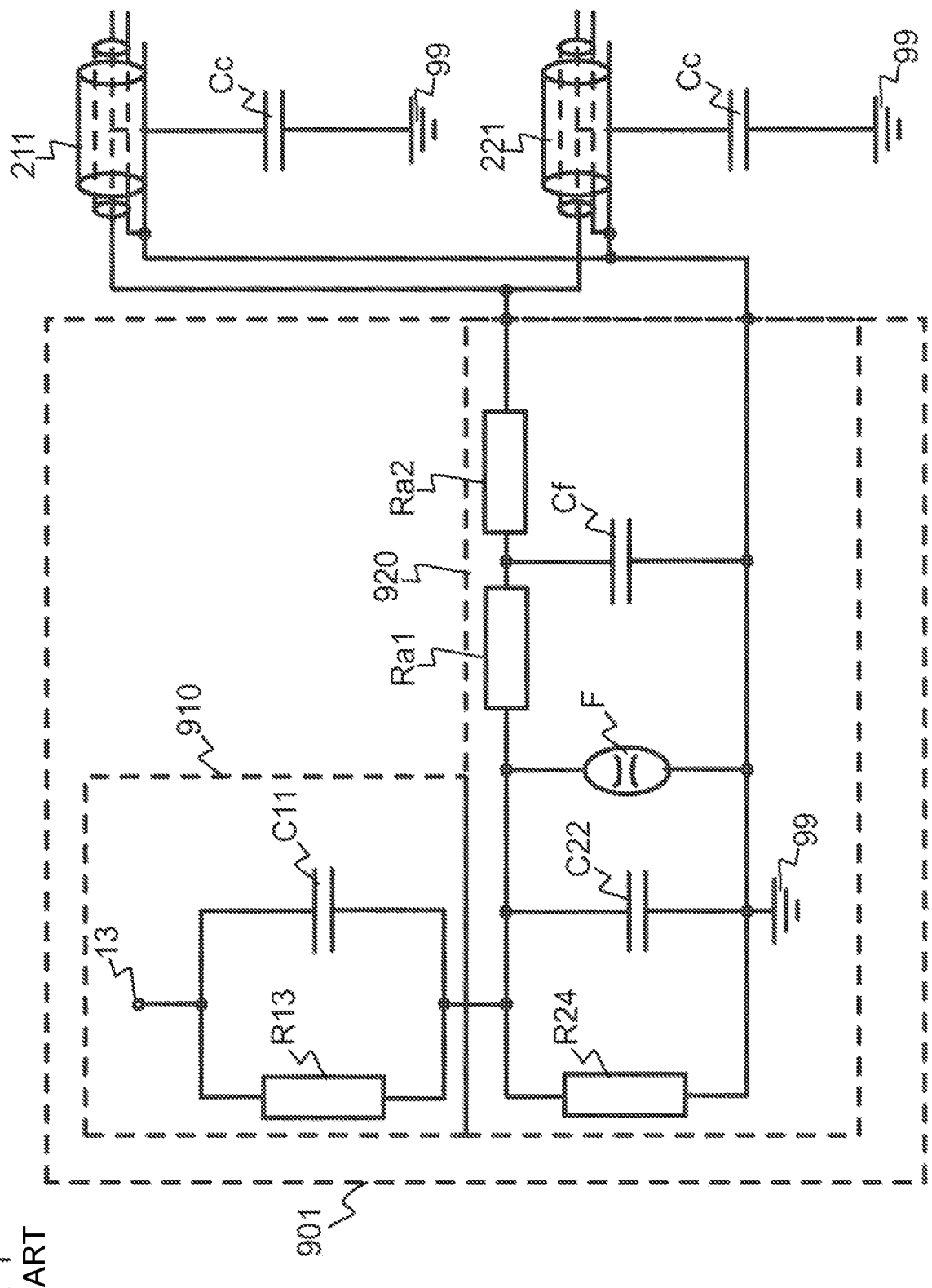
FIG. 1 shows an RC voltage divider according to the state of the art.
Figure 2:
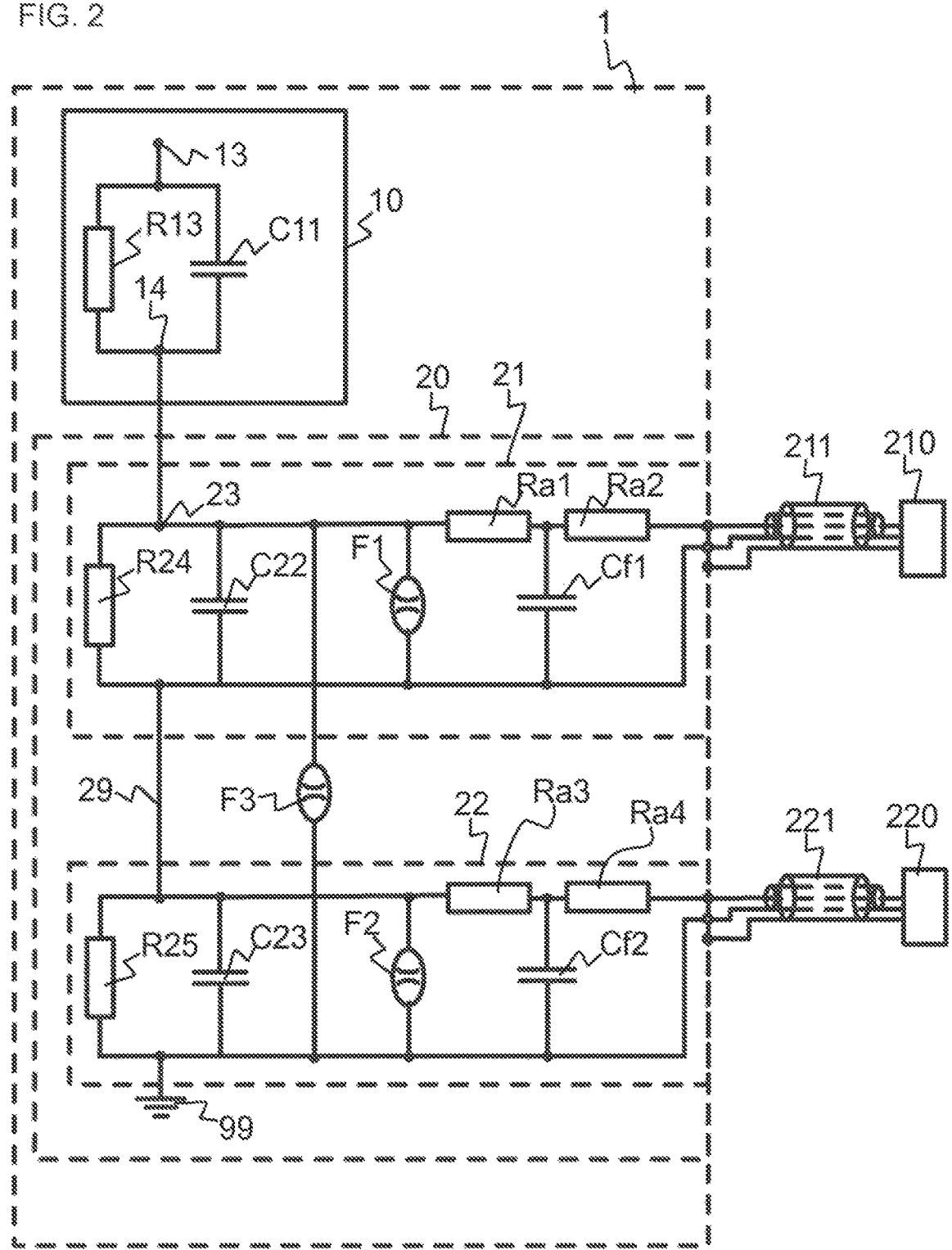
FIG. 2 shows a block diagram of an RC voltage divider according to an embodiment of the invention.

FIG. 2 shows an RC voltage divider 1 according to an embodiment of the invention. The RC voltage divider 1 comprises a primary part 10 and a secondary part 20. The primary part 10 can be the same as the primary part 10 in FIG. 1, or another suitable primary part. However, in the embodiment shown in FIG. 2, the secondary part 20 comprises at least two equivalent output circuits 21, 22 that are connected in series to each other and in series to the primary part 10.

In FIG. 2, each one of the at least two output circuits 21, 22 corresponds to the secondary part 920 of the embodiment shown in FIG. 1. Of course, electronic parts and/or the connection scheme of the output circuits 21, 22 can deviate from the electronic parts of the secondary part 920 shown in FIG. 1, e.g. due to calibration or depending on the requirements of the RC voltage divider. In order to symbolize that, the at least two equivalent output circuits 21, 22 comprise resistive elements R24, R25, Ra1, Ra2, Ra3, Ra4, capacitive elements C22, C23, Cf1, Cf2, and voltage limiters F1, F2.

In addition to the serial connection 29, a voltage limiter F3 is connected between the two output circuits 21, 22. The voltage limiters F1, F2, F3 are preferably based on semiconductor junctions, commonly called "transil". Their function is to protect the other components against accidentally injected overvoltages on the secondary side, for instance in case of wrong tests performed by installators or customers. During normal operation, the transils F1, F2, F3 are open and therefore basically idle, so that the output circuits are not connected via the transils F1, F2, F3. The transils F1, F2, F3 therefore do not affect the circuits 1, 10, 20, 21, 22 during normal operation. The two secondary circuits 21, 22 are protected against accidentally applied overvoltages by means of the transils F1 and F2. The series-connected circuits 21, 22 are protected as well by means of the transil F3.

To each one of the at least two output circuits 21, 22, a separate cable 211, 221 is connected, in order to independently connect redundant measurement- and/or protection equipment 210, 220. Each one of the equipment 210, 220 is therefore connected independently to the voltage divider. Disconnecting one of the measurement and/or protection equipment 210, 220 therefore has only a very limited impact on the other of the measurement and/or protection equipment 210, 220. Therefore, very stable redundant outputs of the RC voltage divider 1 are achieved.

In other words: In order to increase the remaining accuracy after a failure on a redundant output, the influence of the change of impedance must be reduced. Therefore, compared to the solution shown in FIG. 1, in the embodiment of FIG. 2 the whole secondary part, in particular C22 and R24, is doubled, resulting in the second output circuit 22 including C23 and R25, and the two output circuits 21 and 22 are connected in series. According to other embodiments, more than two redundant output circuits comprised by the secondary part 20 are connected in series.

According to a preferred embodiment, at AC-RC voltage dividers even a second tap is installed on the primary capacitance to reduce the temperature influence onto the accuracy.

In the embodiment shown in FIG. 2, the output circuits 21, 22 are equivalent in that their impedances are identical. This allows that the equipment 210, 220 requires less calibration effort. Preferably, the at least two output circuits 21, 22 are equivalent in that they comprise an identical connection scheme, this results in highly equivalent output circuits 21, 22, and a simple design.

The output 14 of the primary part 10 is connected to the input 23 of the secondary part 20. The primary part 10 comprises a plurality of capacitive elements C11. The plurality of capacitive elements C11 of the primary part 10 is adapted to transform a high voltage input signal at the input 13 of the primary part 10 to a low voltage output signal to be fed into the input 23 of the secondary part 20. For example, the primary part 10 is adapted to process a high voltage signal of several hundreds of Kilovolts at the input 13, in order to produce a signal of several hundreds of volts at the output 14.

The secondary part 20 comprises a second plurality of capacitive elements C22, Cf1, C23, Cf2. The secondary part and/or the second plurality of capacitive elements C22, Cf1, C23, Cf2 is adapted to process the low voltage output signal of the primary part at the input 23 of the secondary part 20 in order to generate a divider output signal at each of the at least two equivalent output circuits 21, 22 that is processible by a secondary equipment, such as measurement- and/or protection equipment 210, 220.

According to an embodiment, the primary part 10 is isolated by means of an isolating fluid within an encapsulation. The secondary part is at least partially outside of the isolation and exposable to ambient air. This allows having high voltage parts of the primary part 10 and critical parts of the secondary parts in an isolated environment, while still being able to perform a calibration of the RC voltage divider by adapting that part of the secondary part that is exposable to ambient air.

According to another embodiment, the secondary part 20 is adapted that the output of each one of the at least two equivalent output circuits 21, 22 is influenced by the others of the at least two equivalent output circuits 21, 22 by less than 0.2%. According to another preferred embodiment, due to the high capacitance and low resistance value given in the secondary part, the influence on to the ratio of the whole RC voltage divider 1 is lower than 0.1%, independent on shortened or open circuit secondary system.

The invention claimed is:

1. An RC voltage divider, comprising:
a primary part and a secondary part;
said primary part having an input and an output;
said secondary part having an input connected to said output of said primary part;
said primary part including a plurality of capacitive elements adapted to transform a high voltage input signal at said input of said primary part to a low voltage output signal to be fed into said input of said secondary part;
said secondary part including at least two equivalent output circuits being interconnected in series; and
a voltage limiter connected between said two equivalent output circuits.

2. The RC voltage divider according to claim 1, wherein said at least two equivalent output circuits have substantially identical impedances.

3. The RC voltage divider according to claim 1, wherein said at least two equivalent output circuits include identical connection schemes.

4. The RC voltage divider according to claim 1, wherein said secondary part is adapted to process the low voltage output signal of said primary part at said input of said secondary part in order to generate a divider output signal at each of said at least two equivalent output circuits to be processed by at least one of measurement or protection equipment.

5. The RC voltage divider according to claim 1, wherein said primary part is isolated by an isolating fluid within an encapsulation, and said secondary part is at least partially outside of the isolation and exposable to ambient air.

6. The RC voltage divider according to claim 1, wherein said at least two equivalent output circuits have outputs, and said secondary part is adapted to cause said output of one of said at least two equivalent output circuits to be influenced by others of said at least two equivalent output circuits by less than 0.2%.

7. The RC voltage divider according to claim 1, wherein said at least two equivalent output circuits and said primary part are interconnected in series.

* * * * *